US008809124B2

(12) United States Patent
Manusharow et al.

(10) Patent No.: US 8,809,124 B2
(45) Date of Patent: Aug. 19, 2014

(54) BUMPLESS BUILD-UP LAYER AND LAMINATED CORE HYBRID STRUCTURES AND METHODS OF ASSEMBLING SAME

(71) Applicant: Intel Corporation, Santa Clara, CA (US)

(72) Inventors: Mathew J Manusharow, Phoenix, AZ (US); Mark S Hlad, Chandler, AZ (US); Ravi K Nalla, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/934,522

(22) Filed: Jul. 3, 2013

(65) Prior Publication Data

US 2013/0344662 A1     Dec. 26, 2013

Related U.S. Application Data

(62) Division of application No. 12/962,358, filed on Dec. 7, 2010, now Pat. No. 8,508,037.

(51) Int. Cl.
*H01L 23/485* (2006.01)

(52) U.S. Cl.
USPC ....... 438/125; 438/678; 438/687; 257/E23.02

(58) Field of Classification Search
USPC ................................ 257/E23.035, E23.036
See application file for complete search history.

(56) References Cited

U.S. PATENT DOCUMENTS

| 7,019,404 | B2 | 3/2006 | Rokugawa et al. |
| 7,423,335 | B2 | 9/2008 | Yang et al. |
| 2007/0025092 | A1 | 2/2007 | Lee et al. |
| 2009/0095509 | A1 | 4/2009 | Hirano et al. |
| 2009/0294942 | A1 | 12/2009 | Palmer et al. |

FOREIGN PATENT DOCUMENTS

WO     2012/078377 A1     6/2012

OTHER PUBLICATIONS

International Preliminary Report on Patentability and Written Opinion received for PCT Patent Application No. PCT/US2011/062097, mailed on Jun. 20, 2013, 8 pages.
International Search Report and Written Opinion Received for PCT Patent Application No. PCT/US2011/062097 Mailed on May 21, 2012, 11 pages.

*Primary Examiner* — Stephen W Smoot
(74) *Attorney, Agent, or Firm* — Winkle, PLLC

(57) ABSTRACT

A structure includes a hybrid substrate for supporting a semi-conductive device that includes a bumpless build-up layer in which the semiconductive device is embedded and a laminated-core structure. The bumpless build-up layer and the laminated-core structure are rendered an integral apparatus by a reinforcement plating that connects to a plated through hole in the laminated-core structure and to a subsequent bond pad of the bumpless build-up layer structure.

20 Claims, 13 Drawing Sheets

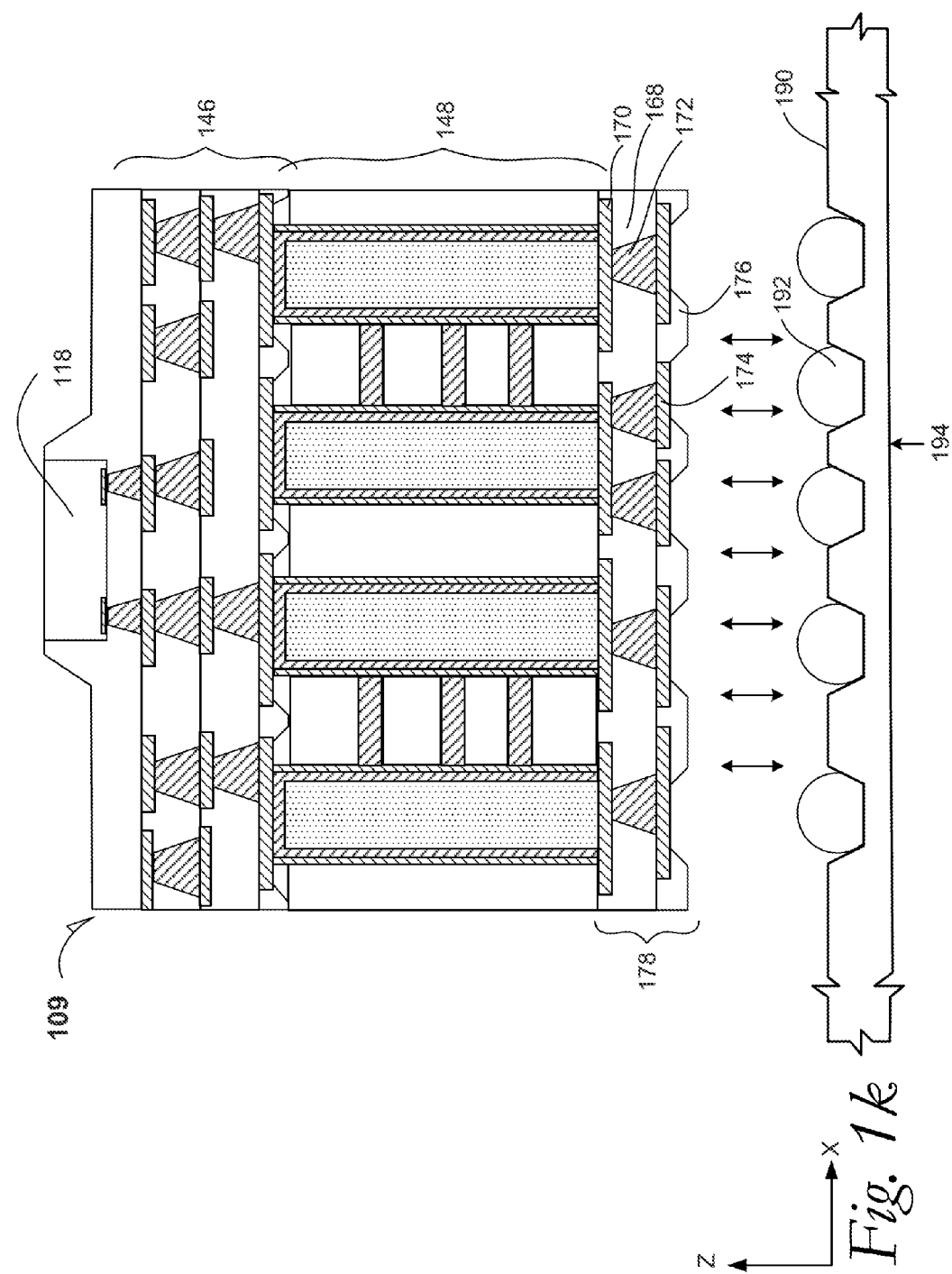

BUMPLESS BUILD-UP LAYER AND LAMINATED CORE HYBRID STRUCTURES AND METHODS OF ASSEMBLING SAME

RELATED APPLICATIONS

The present application is a Divisional of U.S. application Ser. No. 12/962,358 filed Dec. 7, 2010, now U.S. Pat. No. 8,508,037 issued Aug. 13, 2013, entitled "BUMPLESS BUILD-UP LAYER AND LAMINATED CORE HYBRID STRUCTURES AND METHODS OF ASSEMBLING SAME".

Disclosed embodiments relate to semiconductive device substrates and processes of assembling them as semiconductive device apparatuses.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIG. 1k is a cross-section elevation of the semiconductive device apparatus depicted in FIG. 1j after further processing according to an embodiment;

DETAILED DESCRIPTION

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings.

Figure 1A:
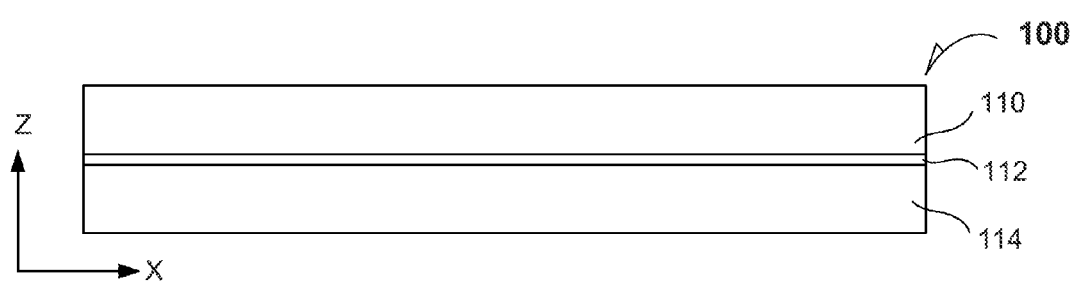
FIG. 1a is a cross-section elevation of a semiconductive device substrate during processing according to an example embodiment.

FIG. 1a is a cross-section elevation of a semiconductive device substrate 100 during processing according to an example embodiment. The semiconductive device substrate 100 includes a dual-foil structure of a second foil film 110, an etch barrier film 112, and a first foil film 114. In an embodiment, the foil is two layers of copper that are separated by an etch barrier such as an organic film. In an embodiment the etch barrier film 112 is a solder resist material that is impervious to copper etch chemistries.

The thickness of the first foil film 114 (as measured along the Z-direction) may be dictated by a given die thickness that will be embedded within the second foil film 114 after etching a die cavity.

Figure 1B:
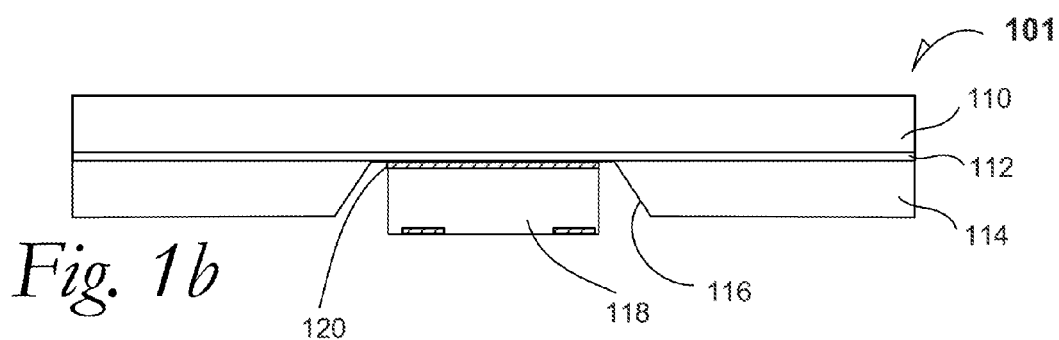
FIG. 1b is a cross-section elevation of the semiconductive device substrate depicted in FIG. 1a after further processing according to an embodiment.

FIG. 1b is a cross-section elevation of the semiconductive device substrate depicted in FIG. 1a after further processing according to an embodiment. The semiconductive device substrate 101 has been processed by patterning a dry film and etching a cavity 116 into the first foil film 114. A semiconductive device such as a die 118 has been seated onto the etch barrier film 112. In an embodiment, the die 118 is attached by dispensing an adhesive 120 into the cavity 116, or by pre-attaching the adhesive film 120 onto the back of the die before seating the die 118. The adhesive film 120 is depicted in FIG. 1b, and it may be present in selected embodiments although not illustrated unless it is explicitly excluded.

Figure 1C:
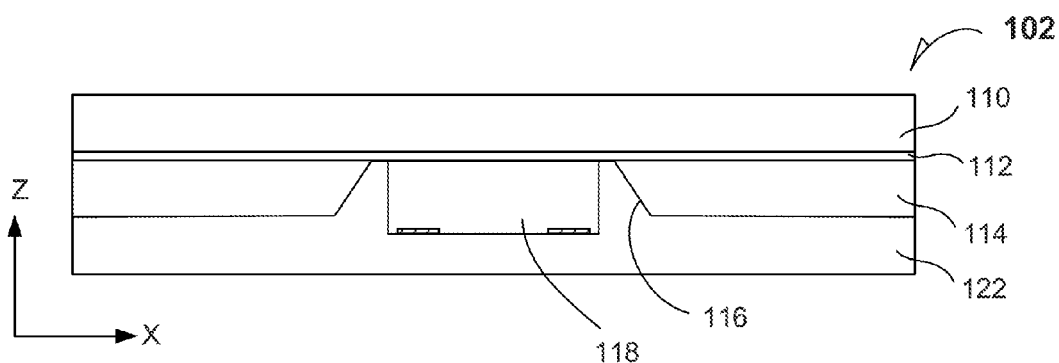
FIG. 1c is a cross-section elevation of the semiconductive device substrate depicted in FIG. 1b after further processing according to an embodiment.

FIG. 1c is a cross-section elevation of the semiconductive device substrate depicted in FIG. 1b after further processing according to an embodiment. The semiconductive device substrate 102 has been processed by laminating a dielectric first film 122 over the entire panel that makes up the semiconductive device substrate 102 when approached from the negative-Z direction. The die 118 has been encapsulated by the lamination process as illustrated In an embodiment, the dielectric first film 122 is attached after a roughening process on the first foil film 114 to facilitate adhesion of the dielectric first film 122 thereto. In an embodiment, chemical etching to form the recess 116 in the first foil film 114 is done before seating the die 118. Chemical etching facilitates roughening the first foil film 114. Hereinafter the dielectric first film 122 may be referred to as bumpless build-up layer (BBUL) first film 122 unless explicitly otherwise indicated.

Figure 1D:
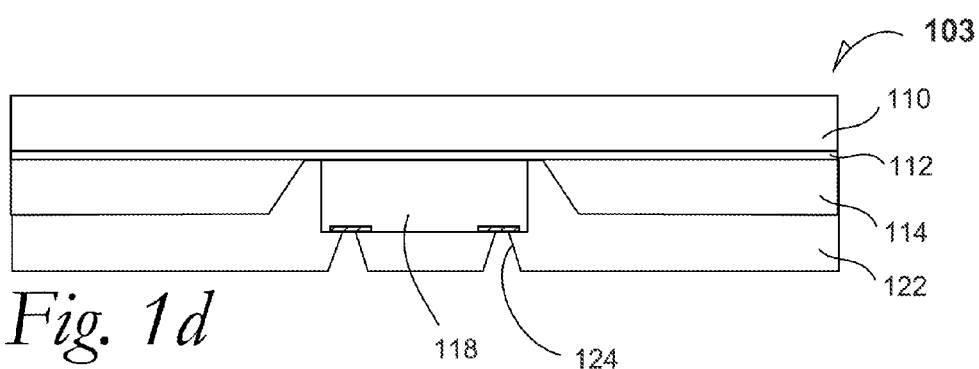
FIG. 1d is a cross-section elevation of the semiconductive device substrate depicted in FIG. 1c after further processing according to an embodiment.

FIG. 1d is a cross-section elevation of the semiconductive device substrate depicted in FIG. 1c after further processing according to an embodiment. The semiconductive device substrate 103 has been processed to form die vias 124 into the BBUL first film 122 to open contacts to the die 118. The die vias 124 have been formed by laser drilling and subsequent desmear cleaning to clean resin smear from the bottom of the die via and roughen the surface of the dielectric first film 122 for further build up processing.

Figure 1E:
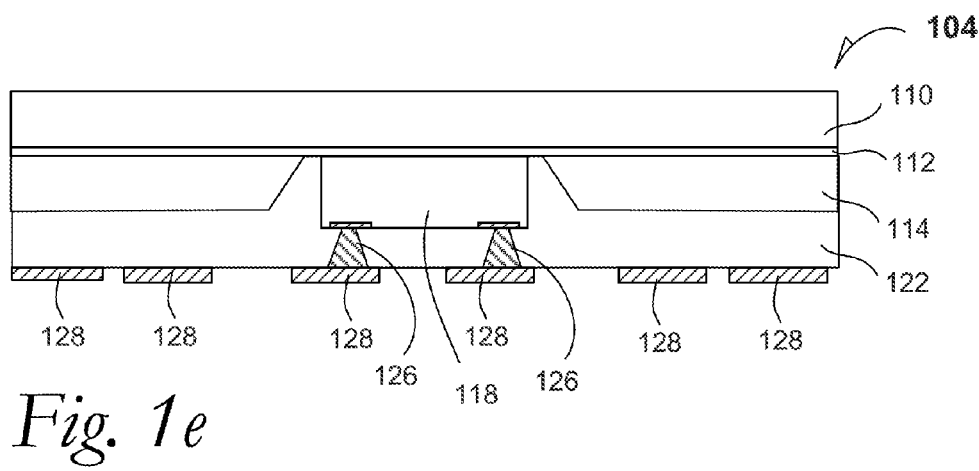
FIG. 1e is a cross-section elevation of the semiconductive device substrate depicted in FIG. 1d after further processing according to an embodiment.

FIG. 1e is a cross-section elevation of the semiconductive device substrate depicted in FIG. 1d after further processing according to an embodiment. The semiconductive device substrate 104 has been processed by semi-additive process (SAP) to fill first contacts 126 into the die vias 124 (FIG. 1d) and form the first contact pads 128. After forming the contacts 126 and first contact pads 128, the semi-additive process (SAP) is used for further build-up layer coupling of the die 118 to the outside world.

Figure 1F:
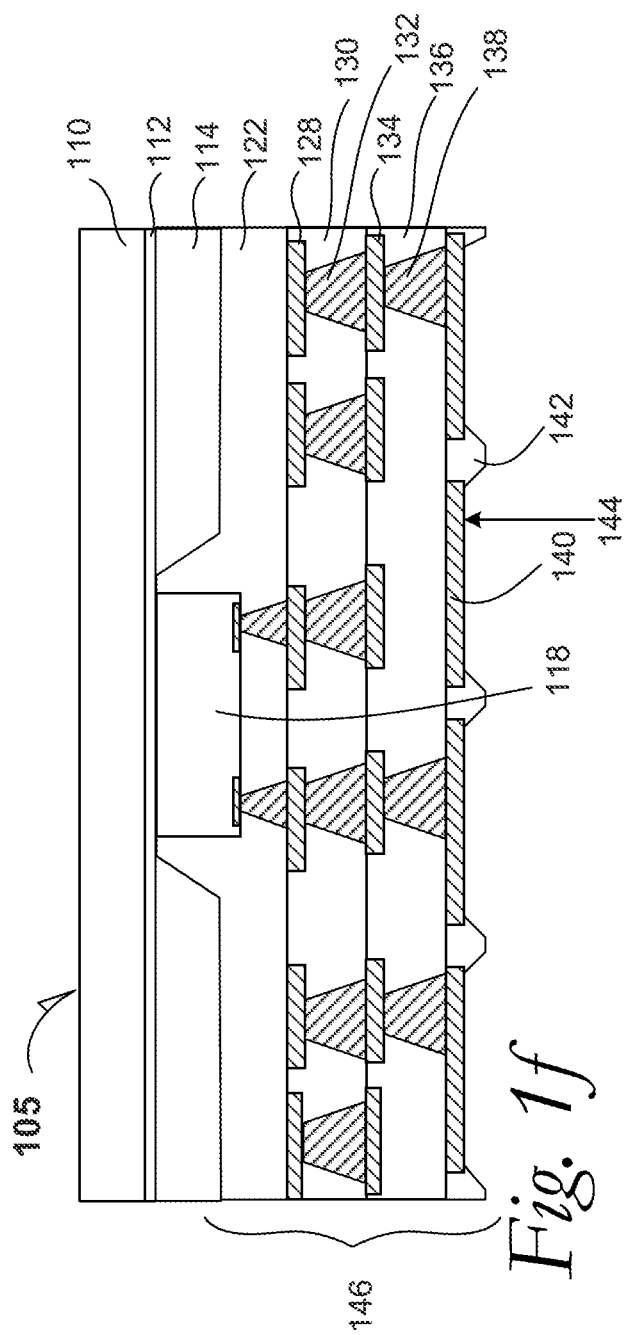
FIG. 1f is a cross-section elevation of the semiconductive device substrate depicted in FIG. 1e after further processing according to an embodiment.

FIG. 1f is a cross-section elevation of the semiconductive device substrate depicted in FIG. 1e after further processing according to an embodiment. The semiconductive device substrate 105 has been processed with a BBUL second film 130 along with BBUL second contacts 132 (one of which is enumerated), and BBUL second contact pads 134. It can also be seen that a BBUL subsequent film 136 has been formed as the last BBUL layer in the illustrated embodiment. Further, BBUL subsequent contacts 138 and BBUL subsequent contact pads 140 have been associated with the BBUL subsequent film 136. The BBUL subsequent contact pads 140 are exposed through a laminated core interface mask 142. The BBUL subsequent film 136 as well as the BBUL subsequent contact pads 140 form a laminated core interface 144 as will be further described in this disclosure.

It is seen that the BBUL third film 130 is abutting the BBUL subsequent film 136. It may now be understood that more than the three depicted BBUL films may be present such that the BBUL subsequent film 136 may have other than the BBUL second film 132 abutting thereto. In other words, a BBUL third film may be located between the BBUL second film 132 and the BBUL subsequent film 136, along with appurtenant BBUL third contacts and third contact pads. It may now also be understood that more than a BBUL third film may be present according to a given application requirement, followed by the BBUL subsequent film 136 and the BBUL subsequent contact pads 140 forming the laminated core interface 144. In an embodiment, the BBUL first film 122, BBUL second film 130, and BBUL subsequent film 136 are complemented with a BBUL third film abutting each of the BBUL second film 130 and BBUL subsequent film 136. In an embodiment, the BBUL first film 122, BBUL second film 130, and BBUL subsequent film 136 are complemented with BBUL third- and fourth films disposed between and abutting the BBUL second film 130 and BBUL subsequent film 136. More BBUL films may be fabricated into the BBUL structure where a given application to that effect is useful.

Hereinafter, the BBUL structure that includes, beginning with the BBUL first film 122 and ending (in the negative Z-direction) with the BBUL subsequent contact pads 140 and interface mask 142, may be referred to as the BBUL structure 146.

Figure 1G:
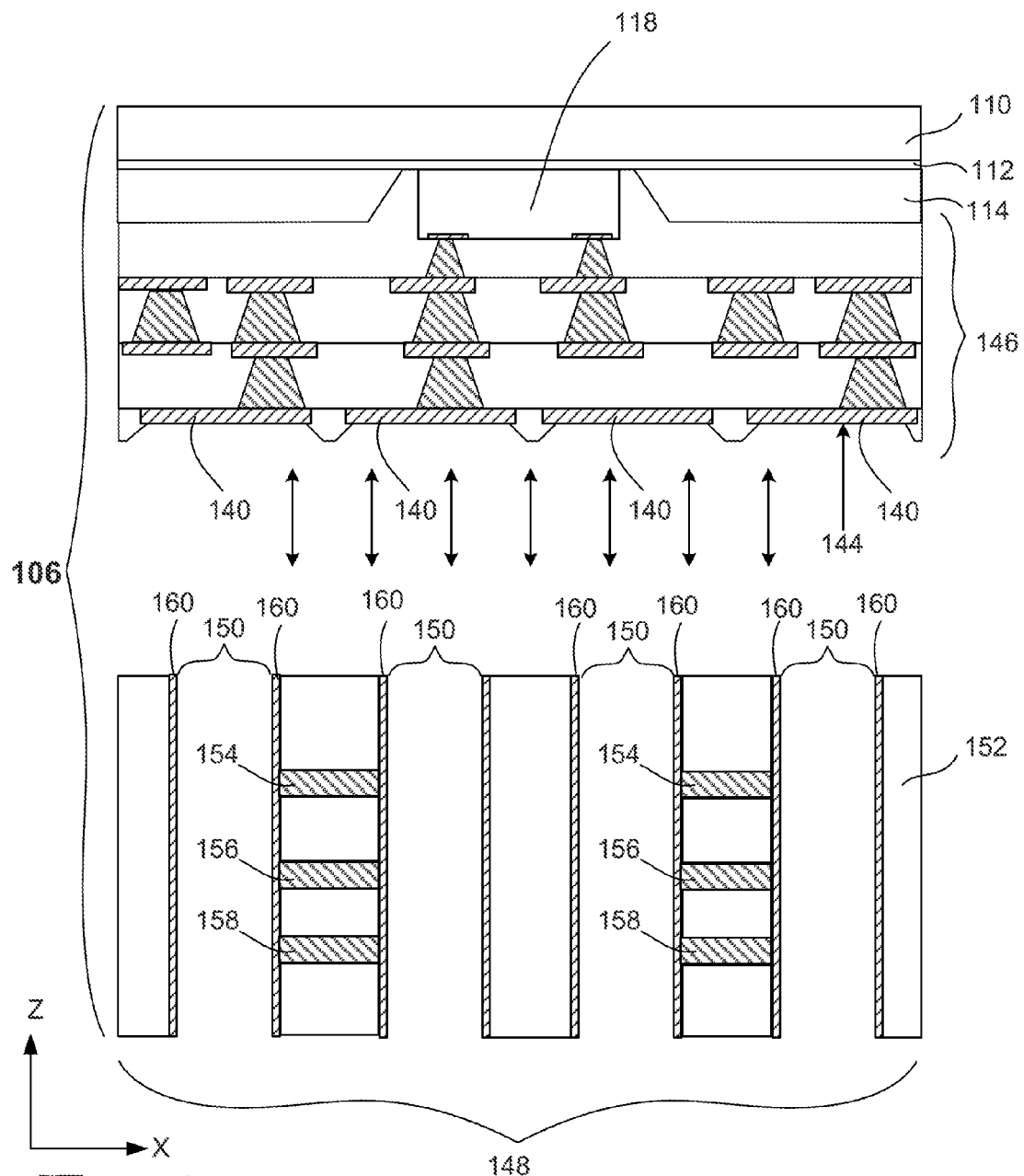
FIG. 1g is a cross-section elevation of a semiconductive device apparatus that includes the BBUL structure and a laminated-core structure during assembly according to an example embodiment.

FIG. 1g is a cross-section elevation of a semiconductive device apparatus 106 that includes the BBUL structure 146, the die 118 embedded therein, and a laminated-core structure 148 during assembly according to an example embodiment.

The laminated-core structure 148 has been processed by mechanically drilling through holes 150 in a laminated core 152. The laminated core 152 may include an organic bulk material 152 as well as metallic interlayers 154, 156, and 158 by way of non-limiting example embodiment. Three metallic interlayers are depicted, but more or less may be present. In an embodiment, only one metallic interlayer is present. In an embodiment, between four and 10 metallic interlayers are present. It is also seen that the metallic interlayers 154, 156, and 158 short two PTHs to each other (two occurrences). Depending upon a given power or signal-deliver requirement of a given die 118, more than two PTHs may be shorted into each other by use of at least one metallic interlayer.

In an embodiment, the laminated core 148 is a prepreg material such as a woven glass and epoxy (FR4) material. Other structures may be used for the laminated core 148 according to a given application.

In an embodiment, each through hole 150 has a width (measured along the X-direction) in a range from 100 micrometer (μm) to 350 μm. In an embodiment, each through hole 150 has a width in a range from 100 μm to 350 μm. The laminated-core structure 148 as a whole may have a thickness (measured in the Z-direction) in a range from 400 μm to 1,400 μm according to an embodiment. In an embodiment, the through holes 150 have been bored with a mechanical drill such that the through holes 150 have a substantially right cylindrical form factor with the width and the thickness embodiments acting as dimensional descriptions. In an embodiment, the width of the through holes 150 is 100 μm and the thickness is 400 μm. In an embodiment, the width of the through holes 150 is 100 μm and the thickness is 1,400 μm. In an embodiment, the width of the through holes 150 is 350 μm and the thickness is 400 μm. In an embodiment, the width of the through holes 150 is 350 μm and the thickness is 1,400 μm.

After drilling the through holes 150, desmear, e-less Cu plating, and e-lytic Cu plating is carried out to form plated through holes (PTHs) 160, which may be referred to by as a plating first film 160 upon a PTH wall. Plated Cu on both surfaces of the laminated-core structure 148 is removed by mechanical grinding.

The semiconductive device apparatus 106 is shown being assembled in the Z-direction by the directional arrows such that the laminated core interface 144 of the BBUL structure 146 mates with the laminated core 148 at the several BBUL subsequent bond pads 140.

Figure 1H:
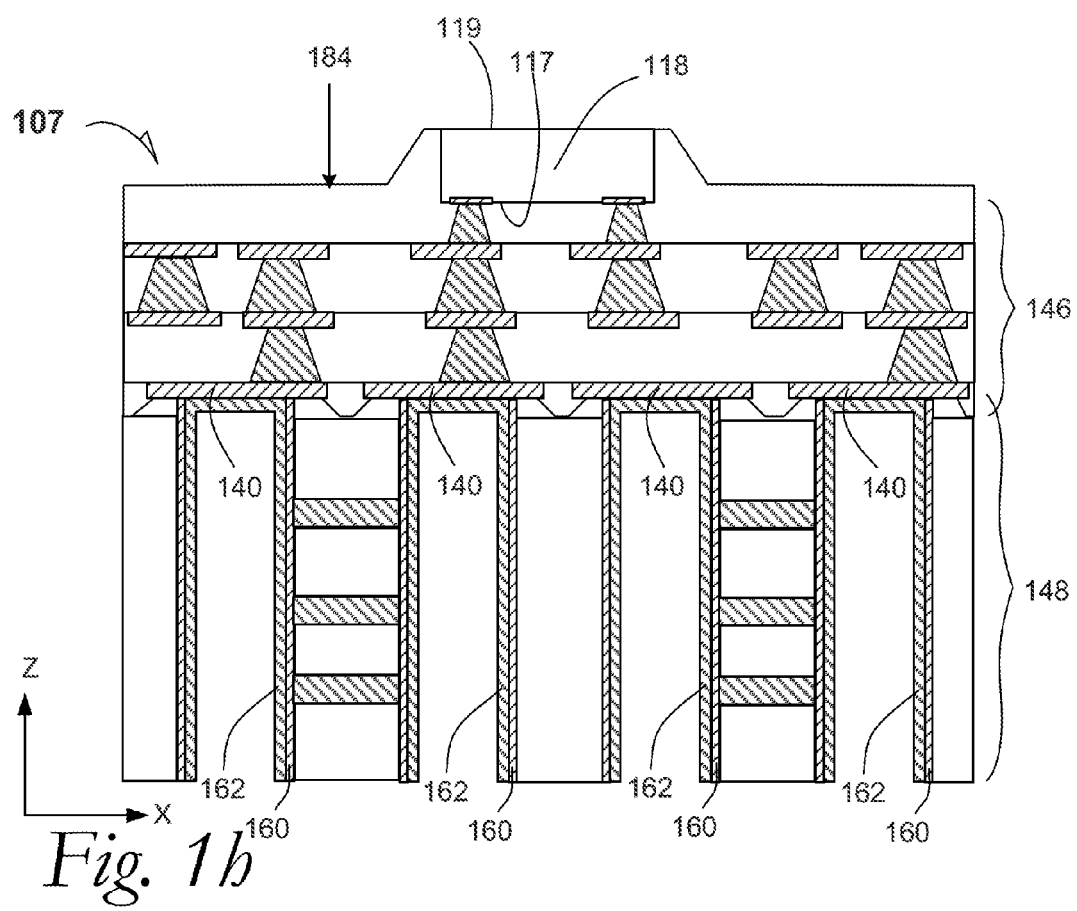
FIG. 1h is a cross-section elevation of the semiconductive device apparatus depicted in FIG. 1g after further processing according to an embodiment.

FIG. 1h is a cross-section elevation of the semiconductive device apparatus depicted in FIG. 1g after further processing according to an embodiment. The semiconductive device apparatus 107 has been processed by removing the foil structures to expose the die 118 at the backside 119 thereof. The semiconductive device apparatus 107 now has a die side 184 that is exposed. The active side 117 of the die 118 is also referred to as the active surface 117. The active surface 117 is in contact with the first contacts 126 (see FIG. 1e). It may now be appreciated that cooling solutions such as heat sinks, heat spreaders, heat slugs, and the like may be assembled to abut the die backside 119.

Further processing includes plating into the PTH 160 by a fast electroless plating technique to form an electrically conductive body that is a reinforcement plating 162 according to an embodiment. The reinforcement plating 162 forms upon the sidewalls that are the PTH 160 as well as upon the BBUL subsequent bond pads 140. The reinforcement plating 162 may also be described as a hollow cylinder that is closed on one end to form a cup shape. The closed end thereof is where the reinforcement plating 162 has formed a connection with the subsequent bond pads 140. The process of forming the electrically conductive body 162 results in a connection to subsequent bond pads 140 that makes the electrically conductive body 162 integral to both the BBUL structure 146 and the laminated-core structure 148. Consequently, an integral structure has been achieved by the process of forming the electrically conductive body 162.

In an embodiment, an electroless copper plating technique is used to form the reinforcement plating 162 to make a useful electrical connection between the laminated-core structure 148 and the BBUL structure 146. In an example embodiment, an electroless copper plating process is carried out by copper plating of the PTH 160 and the BBUL subsequent bond pads 140. Consequently pre-treatment processes upon these surfaces can be avoided due to the autocatalytic nature of e-less Cu plating which does not require a catalyst to be applied if the existing surface to be plated already has Cu on it. In an embodiment, the reinforcement plating 162 forms at a thickness rate of 8 μm/hr with rates available in a range of 2-10 μm per hour. Modification of processing conditions to achieve different plating rates may include temperature, solution agitation, and a solution chemistry of copper dissolved in aqueous, caustic (e.g. NaOH) formaldehyde mixture.

In an example embodiment fast electroless plating is carried out by a copper solution using ethylenediaminetetraacetic acid (EDTA) at a pH of 13 and a temperature of 50° C. that uses cytosine as a stabilizer. In an example embodiment fast electroless plating is carried out by a copper solution using EDTA at a pH of 13 and a temperature of 50° C. that uses benzotriazole as a stabilizer. In an example embodiment fast electroless plating is carried out by a copper solution using EDTA at a pH of 13 and a temperature of 50° C. that uses 2-mercaptobenzothiazole as a stabilizer. In an embodiment, formation of the reinforcement plating 162 is done by use of electroless copper plating.

Figure 1J:
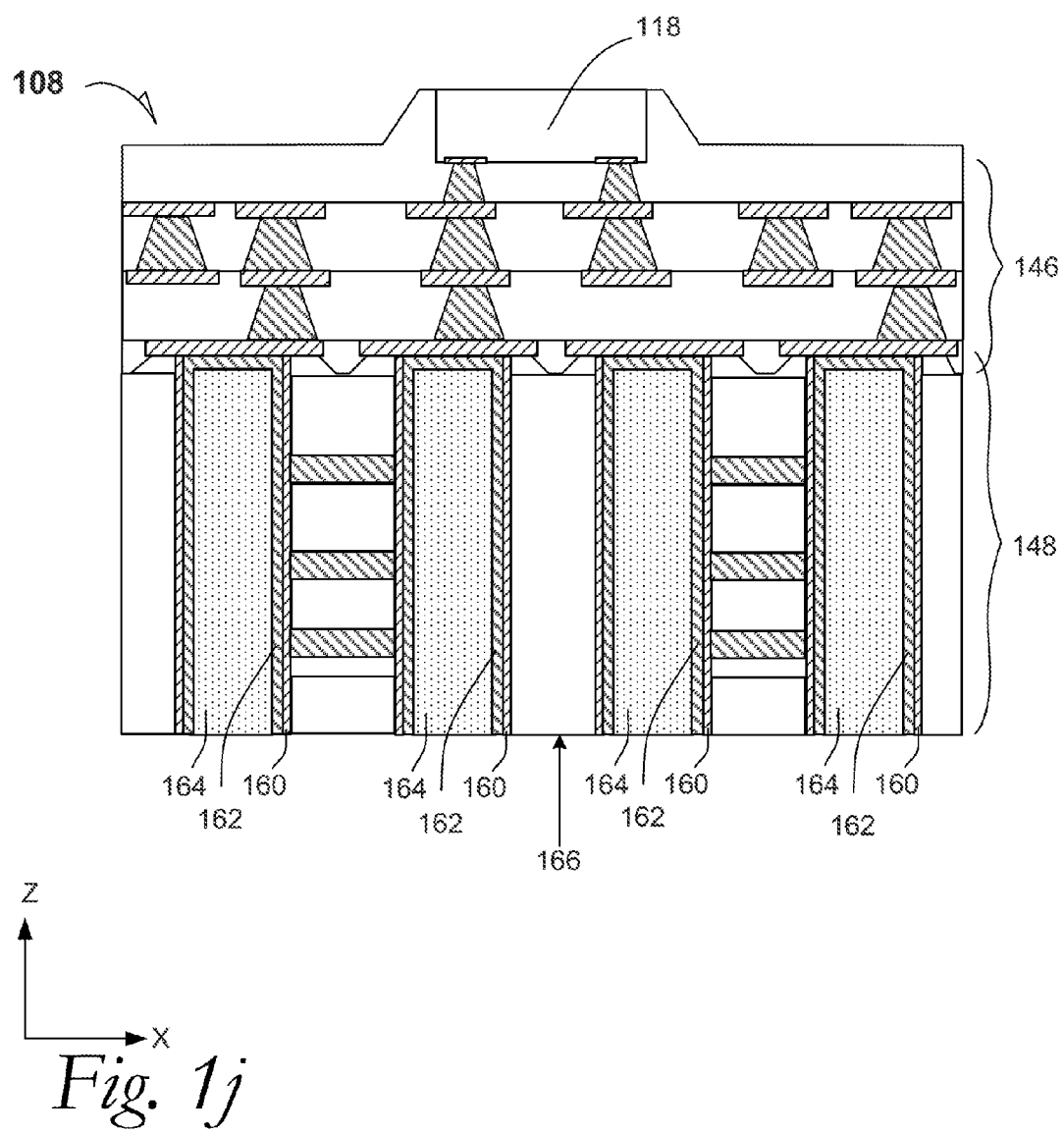
FIG. 1j is a cross-section elevation of the semiconductive device apparatus depicted in FIG. 1h after further processing according to an embodiment.

FIG. 1*j* is a cross-section elevation of the semiconductive device depicted in FIG. 1*h* after further processing according to an embodiment. The semiconductive device apparatus 108 has been processed by filling the PTH 160 and reinforcement plating 162 with a PTH plug 164. For example, an air-core laminated core 148 includes an organic material with an inorganic particulate filler. In an embodiment, the PTH plug 164 is an epoxy material with a silica particulate filler. As such, the PTH plug 164 when it is non-magnetic, may be referred to as an "air core" PTH plug 164. Formation of the PTH plug 164 may be done by forcing fluent filler material 164 into the PTH 160 and 162, curing, and planarizing the bottom 166 to remove any extraneous plug material that is not inside the form factor of the PTH 160 and 162.

Further processing may be done to form a land interface or a land-side structure, which may be carried out at the bottom 166.

FIG. 1*k* is a cross-section elevation of the semiconductive device apparatus depicted in FIG. 1*j* after further processing according to an embodiment. The semiconductive device apparatus 109 has been processed with a land-side film 168 that has been formed over laminated-core land-interface bond pads 170 along with laminated-core interface contacts 172 formed in the land-side film 168. It can be also seen that land-side contact pads 174 have been formed on the laminated-core interface contacts 172, which are further exposed through a land side mask 176. Laminated-core land-interface bond pads 170 are formed by lid Cu plating process and subtractive etching process. Following roughening of the laminated-core land-interface bond pads 170 with a Cu etching solution, the land-side film 168 is laminated. Laminated-core interface contacts 172 are formed by laser drilling, desmear cleaning of via bottom and surface roughening, and semi-additive processing (SAP) for Cu filling and formation of the land-side contact pads 174.

Hereinafter, the structure that includes, beginning with the laminated-core land-interface bond pads 170 and ending (in the negative Z-direction) with the land-side contact pads 174 and land-side mask 176, may be referred to as the land-side structure 178. It may now be understood that the land-side structure 178 may be formed by semi-additive processing.

The semiconductive device apparatus 109 may be assembled to various structures depending upon a given function requirement. In an embodiment, the semiconductive device apparatus 109 is a second-level apparatus that has interconnects to a ball-grid array. In an embodiment, the semiconductive device apparatus 109 is a second-level apparatus that has interconnects to a pin-grid array. In an embodiment, the semiconductive device apparatus 109 is a second-level apparatus that has interconnects to a land-grid array.

In an embodiment, the semiconductive device apparatus 109 is assembled to a foundation substrate 190 at electrical bumps 192. The semiconductive device apparatus 109 may be mounted to the foundation substrate 190 by contacting the land-side contact pads 174 to the electrical bumps 192 according to an embodiment.

In an example embodiment, the semiconductive device apparatus 109 is an apparatus that holds a semiconductive device such as large die 118 such as an Intel® Xeon® processor and the semiconductive device apparatus 109 is assembled to or is part of a server blade as one of a plurality of large dice. In this embodiment, the foundation substrate 190 represents connection to a server blade and the surface 194 may represent the direction from which the foundation substrate 190 obtains power and communication to service the large die 118.

In an example embodiment, where the semiconductive device apparatus 109 is part of a hand-held device such as a smart phone embodiment or a hand-held reader embodiment, the foundation substrate 190 is a motherboard. In an example embodiment where the semiconductive device apparatus 109 is part of a hand-held device such as a smart phone embodiment or a hand-held reader embodiment, the foundation substrate 190 is an external shell such as the portion an individual touches during use. In an example embodiment where the semiconductive device apparatus 109 is part of a hand-held device such as a smart phone embodiment or a hand-held reader embodiment, the foundation substrate 190 includes both the motherboard and an external shell such as the portion an individual touches during use. The semiconductive device apparatus 109 may also be referred to as a BBUL structure and laminated-core structure hybrid apparatus.

Figure 2:
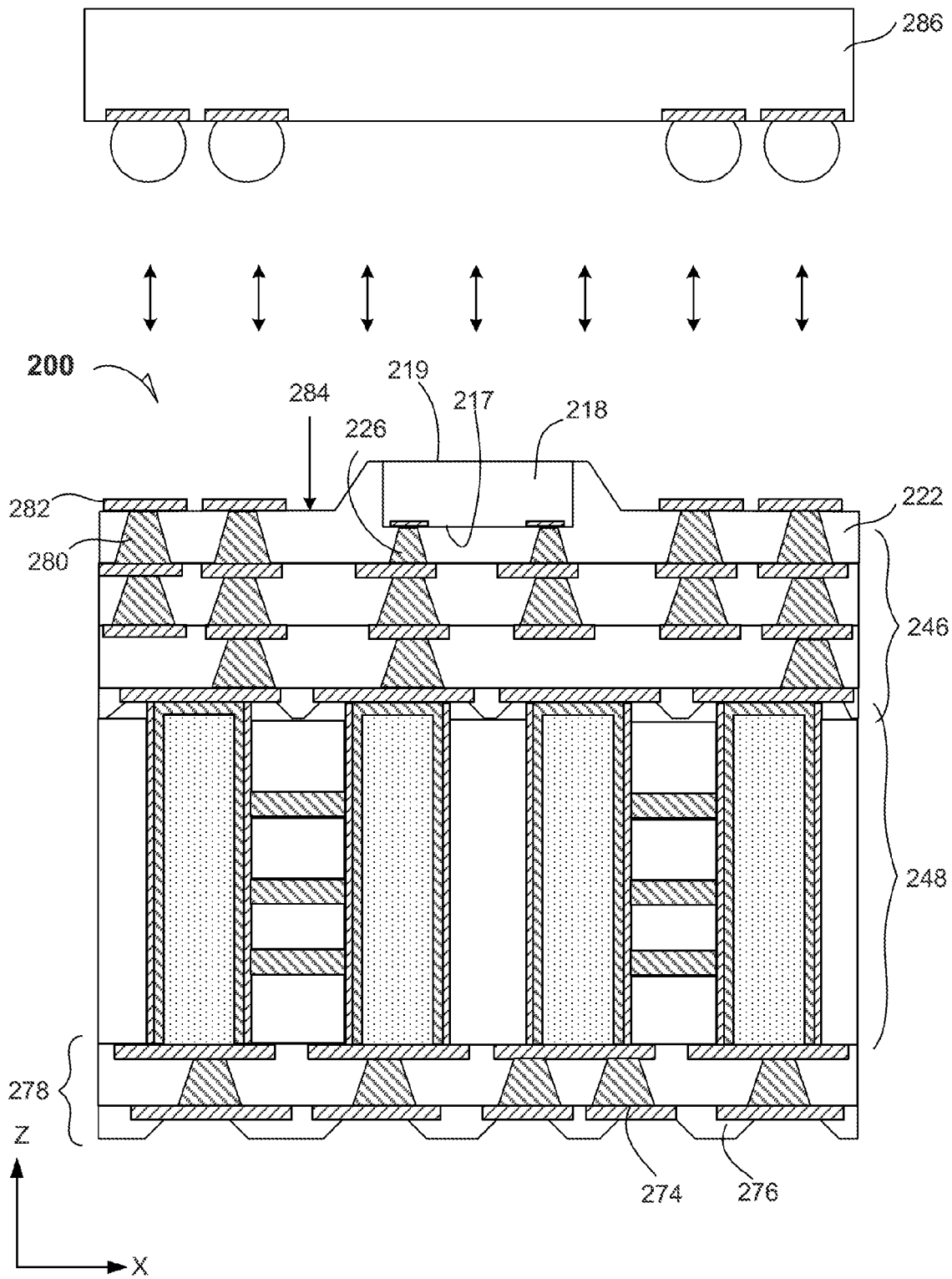
FIG. 2 is a cross-section elevation of a package-on-package semiconductive device apparatus according to an example embodiment.

FIG. 2 is a cross-section elevation of a package-on-package (POP) semiconductive device apparatus 200 according to an example embodiment. The semiconductive device apparatus 200 is similar to the semiconductive device apparatus 109 depicted in FIG. 1*k*, with processing and structural variations. In an embodiment during formation of the BBUL structure 246, the first film 222 is processed to have die-side contacts 280 as well as first contacts 226 that couple directly to the die 218. After peeling the foils, the die-side contacts 280 are connected to die-side contact pads 282 for interfacing with electronic devices upon the package die side 284.

It may now be appreciated that a package-on-package (POP) apparatus 286 may be constructed by assembling a top package 286 at the die-side contact pads 282 to the semiconductive device apparatus 200. In an embodiment, the top package 286 is a memory module that serves as a cache for the semiconductive device 218. In an embodiment, the top package 286 is an RF device that serves as a transceiver for the semiconductive device 218. In an embodiment, the top package 286 includes active devices and cooling solutions at the die back surface 219. In an embodiment, the top package 286 includes passive devices and cooling solutions at the die back surface 219.

It may now be appreciated that a foundation substrate such as the foundation substrate 190 depicted in FIG. 1k, may be assembled to the semiconductive device apparatus 200 according to the several disclosed embodiments. It may also be appreciated that the top package 286 may serve similar external-shell functions as the foundation substrate, but on the opposite side of the semiconductive device apparatus 200.

Figure 3:
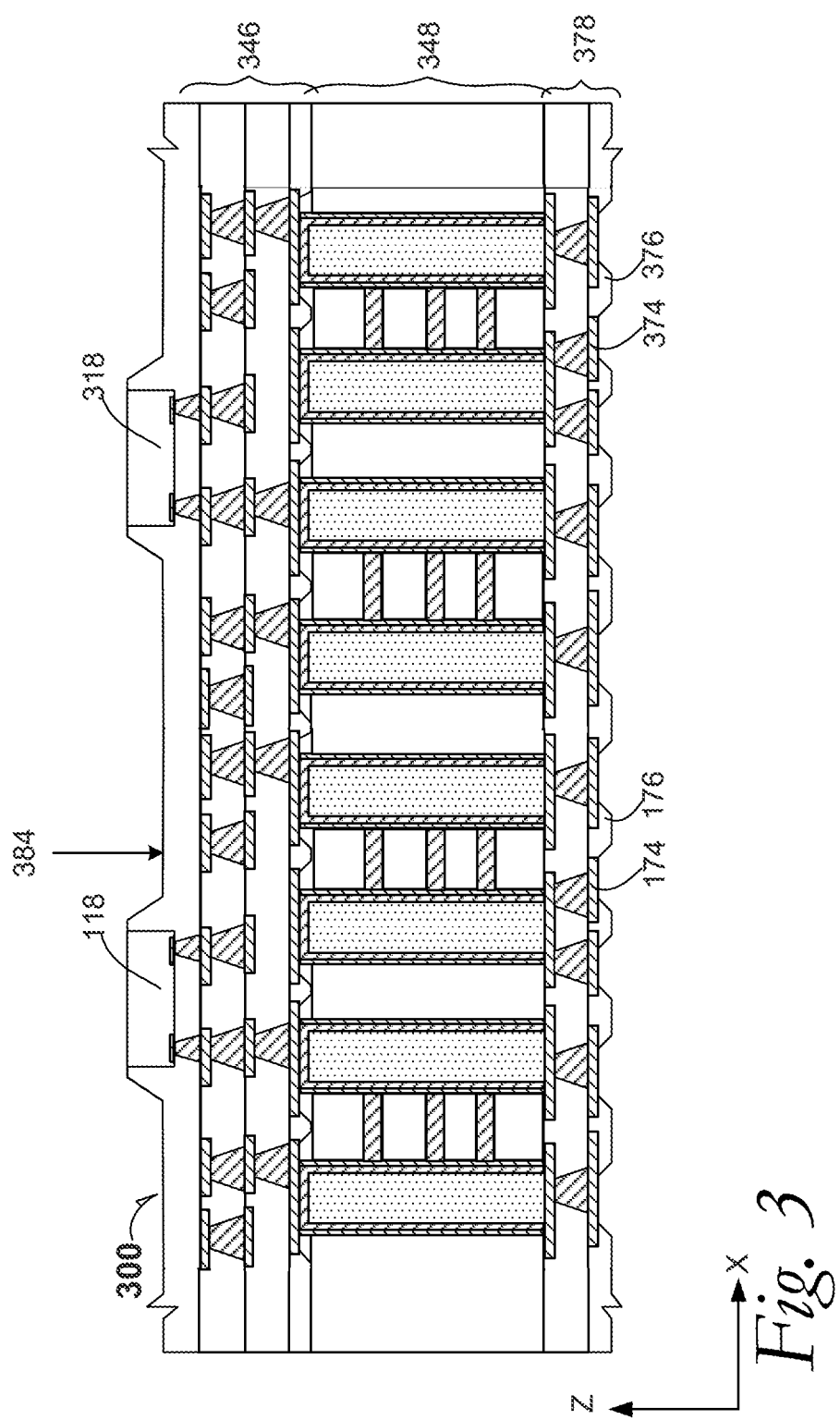
FIG. 3 is a cross-section elevation of a semiconductive device apparatus according to an example embodiment.

FIG. 3 is a cross-section elevation of a semiconductive device apparatus 300 according to an example embodiment. The semiconductive device apparatus 300 is similar to the semiconductive device apparatus 109 depicted in FIG. 1k, with processing and structural variations. In an embodiment during formation of the BBUL structure 346, a plurality of dice 118 and 318 are processed in a foil structure similar to the dual-foil structure of the second foil film 110, the etch barrier film 112, and the first foil film 114 depicted in FIG. 1a.

In an embodiment, the first die 118 is a processor and the subsequent die 318 is also a processor such as in a dual-core system in a package (SiP) semiconductive device apparatus 300. In an embodiment, the first die 118 is a processor and the subsequent die 318 is an integrated processor and graphics device such as an Intel® Sandy Bridge® device. In an embodiment, the first die 118 is a processor such as an Intel® Atom® processor and the subsequent die 318 is an RF intensive device that allows the semiconductive device 300 to be installed in a smart phone. In an embodiment, the first die 118 is a processor and the subsequent die 318 acts as a platform controller hub (PCH) that incorporates traditional functions of North- and South bridge. In an embodiment, the first die 118 is a processor and the subsequent die 318 acts as a discrete graphics controller.

The additional structures of the semiconductive device 300 may be similar to those depicted in other embodiments such as the BBUL structure 346, the laminated-core structure 348, and the land-side structure 178.

It may now be appreciated that a foundation substrate similar to the foundation substrate 190 depicted in FIG. 1k, may be assembled to the semiconductive device apparatus 300 according to the several disclosed embodiments.

It may now also be appreciated that the semiconductive device apparatus 300 may include a second die in addition to the first die 118 and the subsequent die 318. It may now also be appreciated that the semiconductive device apparatus 300 may include a plurality of dice in addition to the first die 118 and the subsequent die 318.

Figure 4:
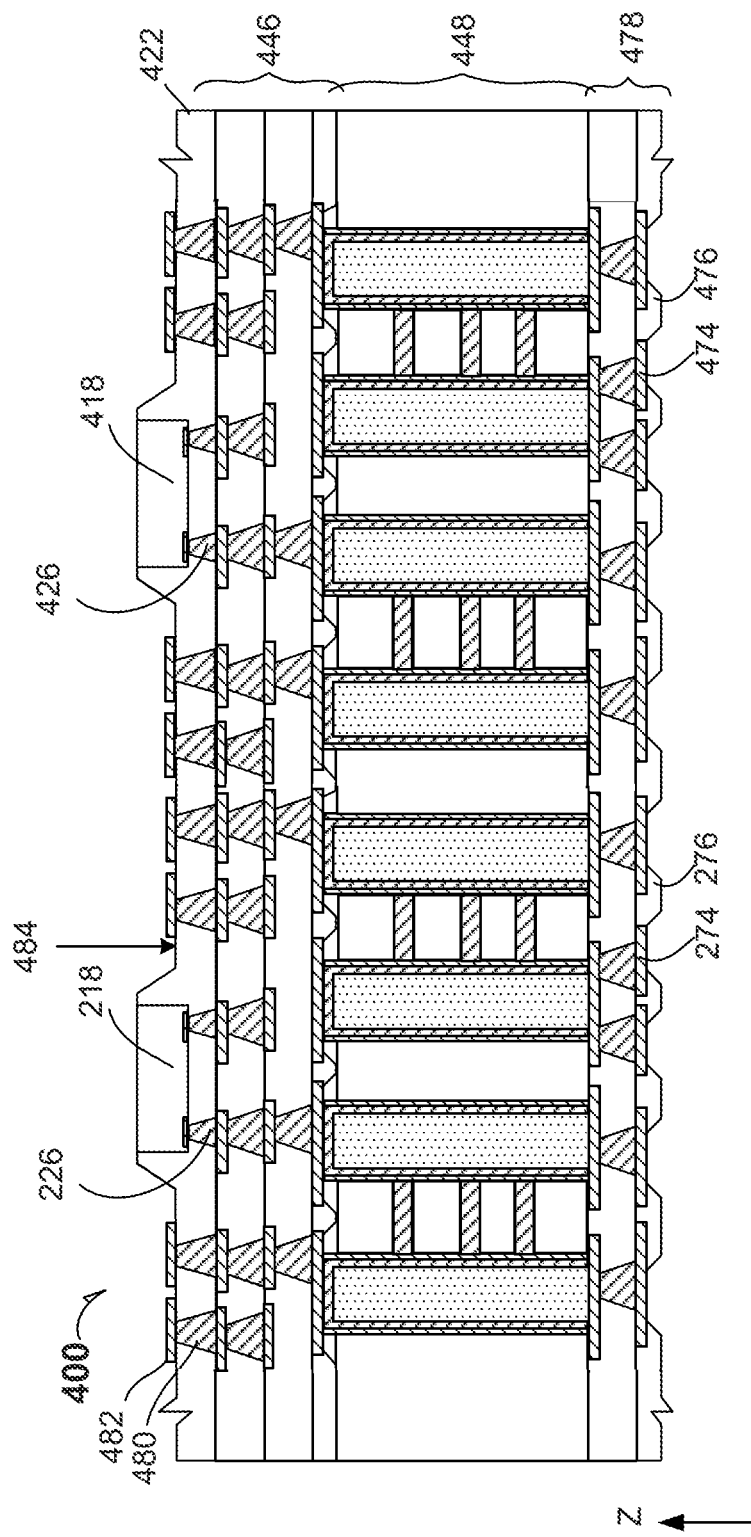
FIG. 4 is a cross-section elevation of a package-on-package semiconductive device apparatus according to an example embodiment.

FIG. 4 is a cross-section elevation of a semiconductive device apparatus 400 according to an example embodiment. The semiconductive device apparatus 400 is similar to the semiconductive device 200 depicted in FIG. 2, with processing and structural variations. In an embodiment during formation of the BBUL structure 446, the first film 422 is processed to have die-side contacts 480 as well as first contacts 226 that couple directly to the first die 218 and additionally subsequent first contacts 426 that couple directly to the subsequent die 418. After peeling the foils, the die-side contacts 480 are connected to die-side contact pads 482 for interfacing with electronic devices upon the package die side 484. It may now be appreciated that a POP apparatus may be constructed by assembling a top package at the die-side contact pads 482 to the semiconductive device apparatus 400. In an embodiment, the top package is a memory module that serves as a cache for the semiconductive device 218. In an embodiment, the top package is an RF device that serves as a transceiver for the semiconductive device 218. In an embodiment, the top package includes active devices and cooling solutions at the die back surface. In an embodiment, the top package includes passive devices and cooling solutions at the die back surface.

In an embodiment during formation of the BBUL structure 446, a plurality of dice 218 and 418 are processed in a foil structure similar to the dual-foil structure of the second foil film 110, the etch barrier film 112, and the first foil film 114 depicted in FIG. 1a. In an embodiment, the first die 218 is a processor and the subsequent die 418 is also a processor such as in a dual-core system in a package (SiP) semiconductive device apparatus 400. In an embodiment, the first die 218 is a processor and the subsequent die 418 is an integrated processor and graphics device such as an Intel® Sandy Bridge® device. In an embodiment, the first die 218 is a processor such as an Intel® Atom® processor and the subsequent die 418 is an RF intensive device that allows the semiconductive device 400 to be installed in a smart phone.

The additional structures of the semiconductive device 400 may be similar to those depicted in other embodiments such as the BBUL structure 446, the laminated-core structure 448, and the land-side structure 478. It may now be appreciated that disclosed POP apparatus embodiments may be constructed by assembling a top package at the die-side contact pads 482 to the semiconductive device apparatus 400.

It may now be appreciated that a foundation substrate similar to the foundation substrate 190 depicted in FIG. 1k, may be assembled to the semiconductive device apparatus 400 according to the several disclosed embodiments.

It may now also be appreciated that the semiconductive device apparatus 400 may include a second die in addition to the first die 118 and the subsequent die 418 by extending assembly in the X-direction. It may now also be appreciated that the semiconductive device apparatus 400 may include a plurality of dice in addition to the first die 118 and the subsequent die 418.

Figure 5:
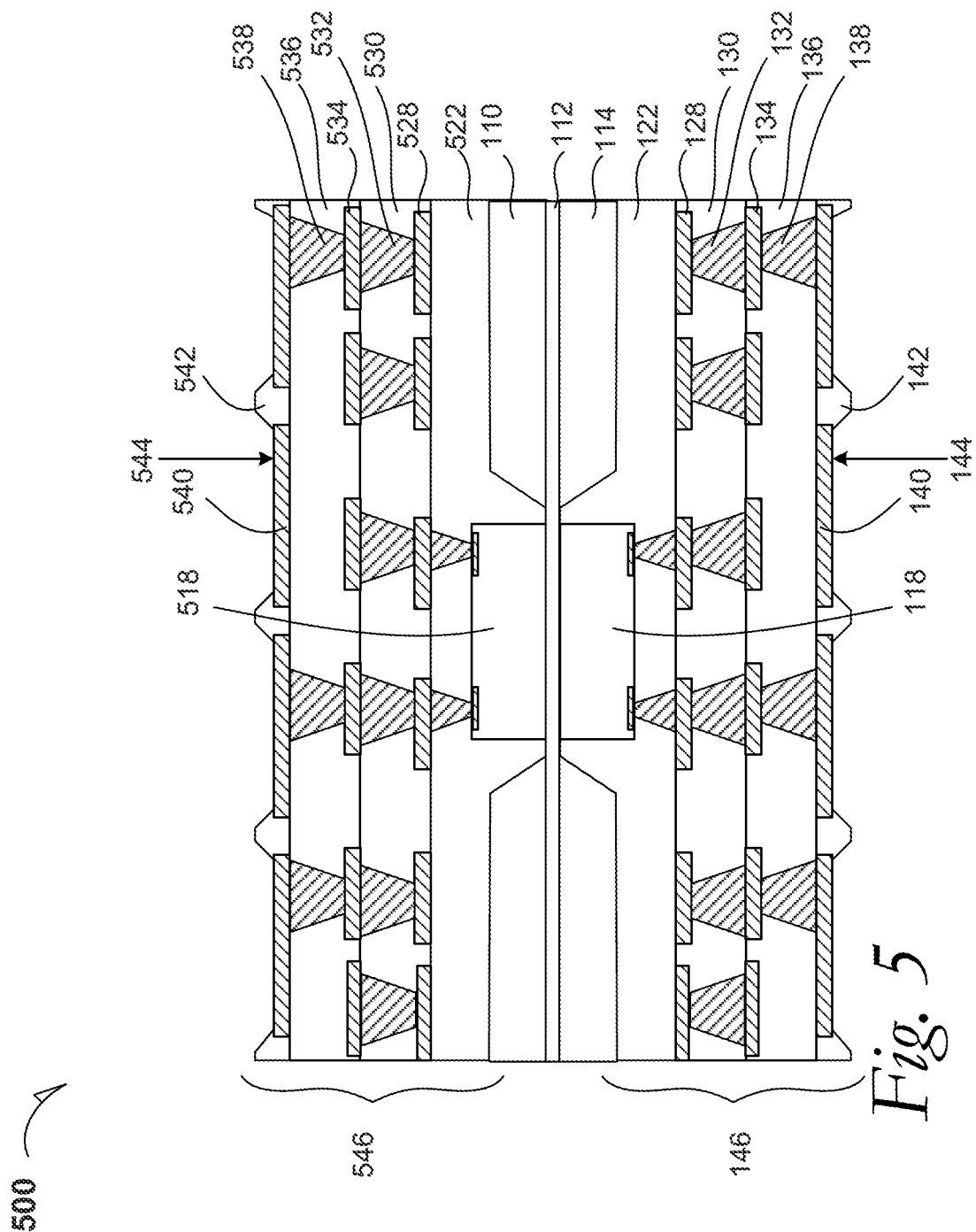
FIG. 5 is a cross-section elevation of two back-to-back semiconductive device apparatus during processing according to an example embodiment.

FIG. 5 is a cross-section elevation of two back-to-back semiconductive device apparatus 500 during processing according to an example embodiment. Similar processing may be appreciated for the apparatus 500 that begins at FIG. 1a and continues to FIG. 1f, with the additional processing factor that the semiconductive device substrate 500 is being processed with back-to-back BBUL fabrication that includes a first die 118 and a duplicate die 518. It may now be understood that the first die 118 is seated in a cavity in a first foil 114 and the second die 518 is seated in a cavity in a second foil 110.

It can be seen that the semiconductive device substrate 500 has been processed with BBUL second films 130 and 530, respectively, along with BBUL second contacts 132 and 532, and BBUL second contact pads 134 and 534. It can be also seen that BBUL subsequent films 136 and 536 have been formed as the last BBUL layers. Further, BBUL subsequent contacts 138 and 538 and BBUL subsequent contact pads 140 and 540 have been associated with the BBUL subsequent films 136 and 536. The BBUL subsequent contact pads 140 and 540 are further exposed through laminated core interface masks 142 and 542. The BBUL subsequent films 136 and 536 as well as the BBUL subsequent contact pads 140 and 540 form laminated core interfaces 144 and 544 as have been described in this disclosure.

It may now be understood that more than the three each depicted BBUL films may be present such that the BBUL subsequent films 136 and 536 may have other than the BBUL second film 132 and 532 abutting thereto. In other words, BBUL third- and duplicate third films may be located between the BBUL second films 132 and 532 and the BBUL subsequent films 136 and 536, along with appurtenant BBUL third- and duplicate third contacts and contact pads. It may now also be understood that more than BBUL third- and duplicate third film may be present according to a given application requirement, followed by the BBUL subsequent films 136 and 536 and the BBUL subsequent contact pads 140 and 540 forming the laminated core interfaces 144 and 544.

The BBUL structure that includes, beginning with the BBUL first films 122 and 522 and ending with the BBUL subsequent contact pads 140 and 540 and interface masks 142 and 542, may be referred to as the respective BBUL structures 146 and 546.

It can now be seen that processing that continues at FIG. 1g may be done back-to-back until cleaving back-to-back structures is done such as at FIG. 1h. It may also be understood that POP packages may be fabricated by similar back-to-back methods according to the several disclosed embodiments. Also, back-to-back multiple first and subsequent dice may be processed such as a first die 218 and a subsequent die 418 as well as a back-to-back first die and subsequent die that are later separated to resemble structure such as depicted in FIG. 4

Figure 6:
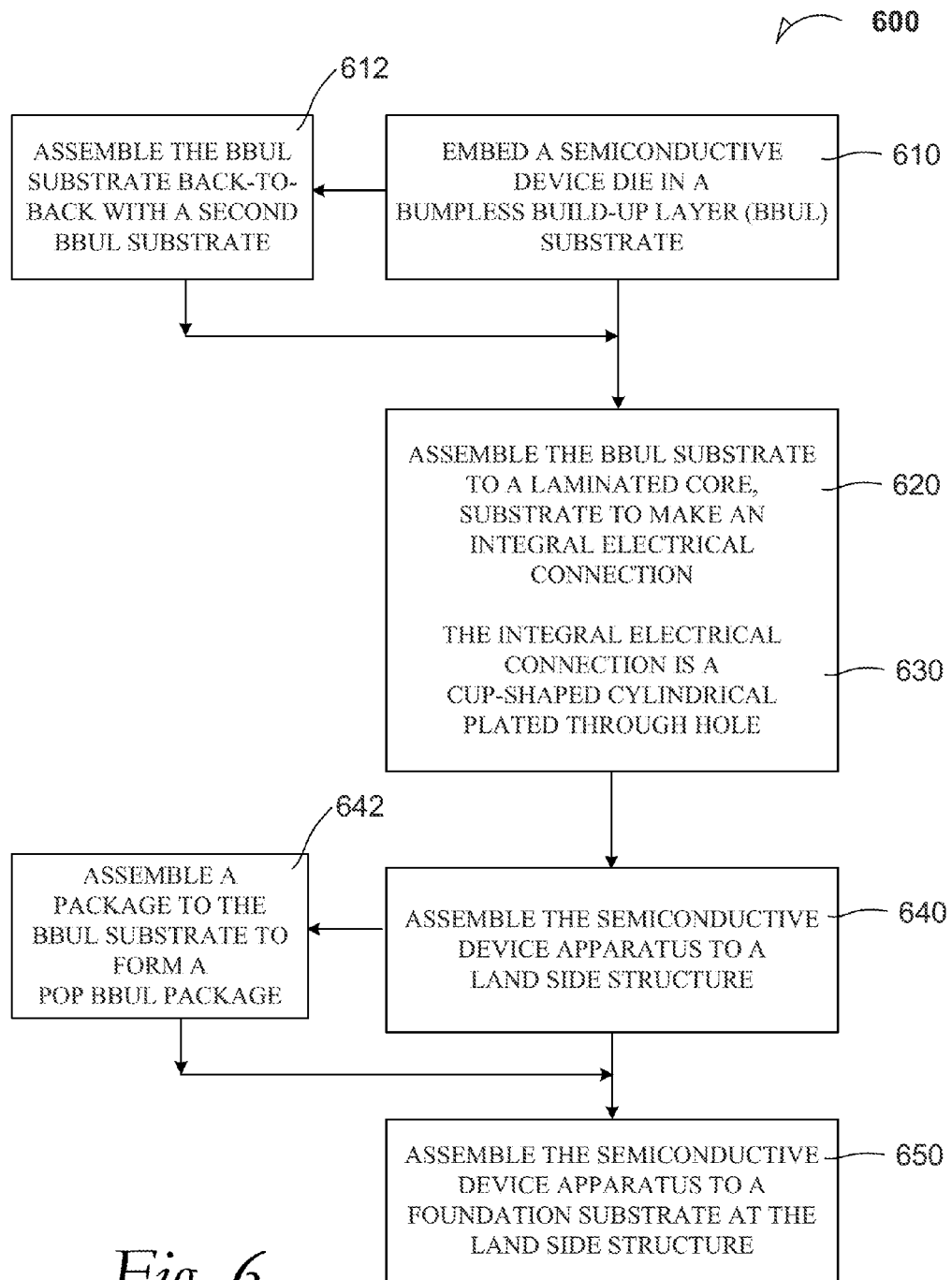
FIG. 6 is a process and method flow diagram according to various embodiments.

FIG. 6 is a process and method flow diagram 600 according to various embodiments At 610, the process includes embedding a semiconductive device in a BBUL structure. In a non-limiting example embodiment, FIGS. 1a to 1k the die 118 is embedded into the BBUL structure 146. It may now be appreciated that more than one semiconductive die such as the first die 118 and the subsequent die 318 may be assembled into the BBUL structure 346. It may further be appreciated that a second die may be present in addition to the first die 118 and the subsequent die 318.

At 612, the process includes assembling the BBUL structure back-to-back with a second BBUL structure. In a non-limiting example embodiment, a first BBUL structure 146 is fabricated simultaneously and back-to-back with a second BBUL structure 546. In an embodiment, throughput is essentially doubled. It may now be appreciated that warpage issues during BBUL structure fabrication are reduced by back-to-back simultaneous processing.

At 620, the process includes assembling the BBUL structure to a laminated core to make an integral electrical connection. The meaning of "integral electrical connection" includes chemical bonding of a reinforcement plating 162 to both a PTH 160 and to a subsequent bond pad 140. By this processing embodiment, an integral structure of a BBUL structure 146 and a laminated-core structure 148 is achieved.

At 630, the process includes the limitation that the integral electrical connection is a cup-shaped cylindrical plated through hole. In a non-limiting example embodiment, the reinforcement plating 162 forms into this shape during electroless copper plating onto the PTH 160 and the subsequent bond pad 140. It may now be appreciated that other shapes may be formed to achieve the integral electrical connection, depending upon the form factor of the through holes formed into the laminated core structure.

At 640, the process includes assembling the semiconductive device apparatus to a land side structure. In a non-limiting example embodiment, the land-side structure 178 is fabricated onto the laminated-core structure 148 by semi-additive processing techniques. In an embodiment, the process commences and 610 and terminates at 640.

At 642, a method embodiment includes assembling a top package to the BBUL structure to tom a POP BBUL package. In a non-limiting example embodiment, a POP apparatus is constructed by assembling the top package 286 at the die-side contact pads 282 to the semiconductive device apparatus 200. It may also be appreciated that cooling solutions may be included in the top package 286 particularly where the die backside 219 may abut the top package 286. In an embodiment, the method commences and terminates at 642.

At 650, a method embodiment includes assembling the semiconductive device apparatus to a foundation substrate at the land side structure. In a non-limiting example embodiment, a foundation substrate 190 is part of a server blade. It may also now be appreciated that the method at 650 includes assembling a first die 118 and a subsequent die 318 into a computer system.

Figure 7:
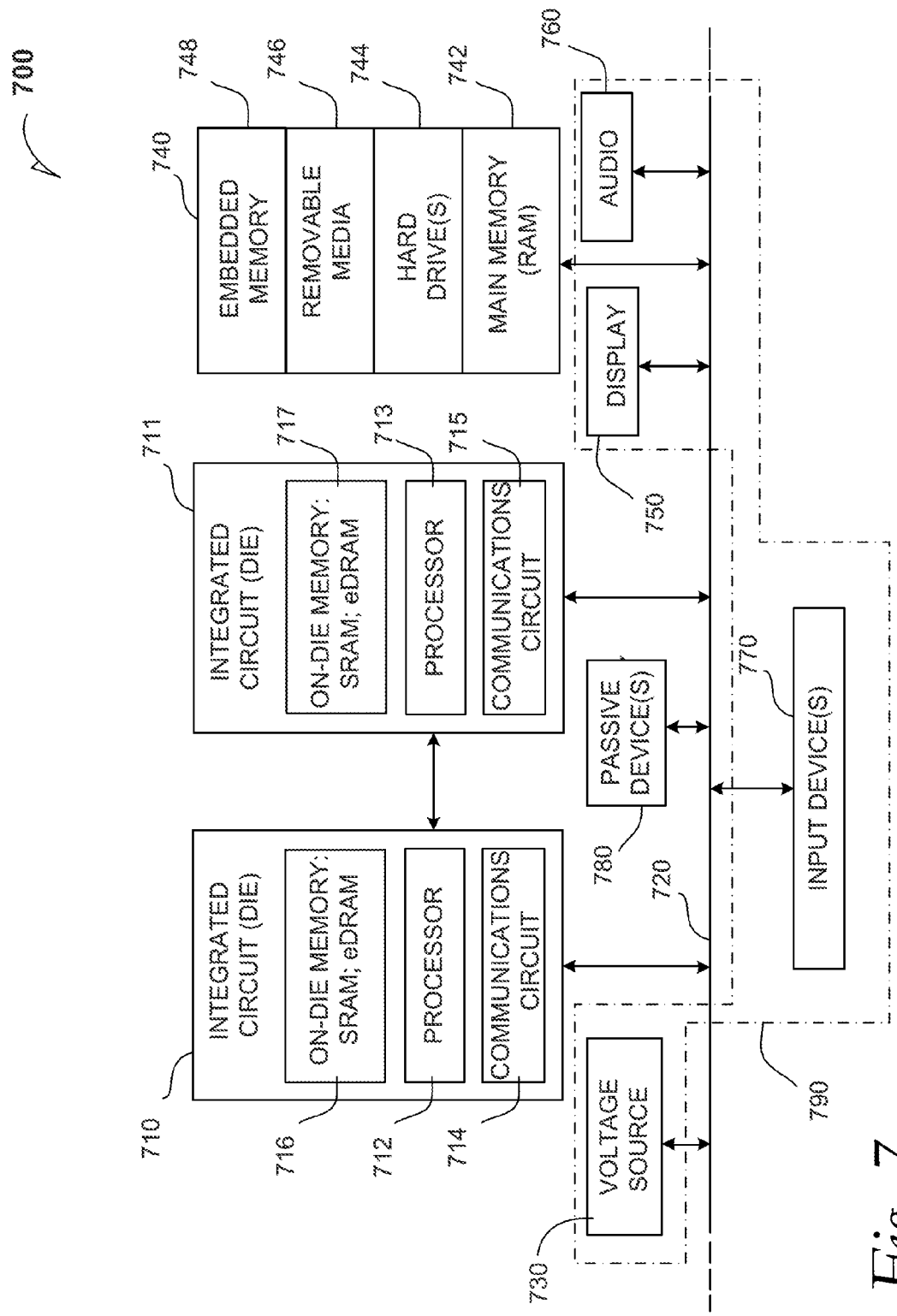
FIG. 7 is a schematic of a computer system according to an embodiment.

FIG. 7 is a schematic of a computer system 700 according to an embodiment. The computer system 700 (also referred to as the electronic system 700) as depicted can embody any BBUL structure and laminated-core structure hybrid apparatus according to any of the several disclosed embodiments and their equivalents as set forth in this disclosure. The computer system 700 may be part of a server blade. The computer system 700 may be a mobile device such as a netbook computer. The computer system 700 may be a mobile device such as a wireless smart phone. The computer system 700 may be a desktop or a laptop computer. The computer system 700 may be a hand-held reader. The computer system 700 may be integral to an automobile. The computer system 700 may be integral to a television.

In an embodiment, the electronic system 700 is a computer system that includes a system bus 720 to electrically couple the various components of the electronic system 700. The system bus 720 is a single bus or any combination of busses according to various embodiments. The electronic system 700 includes a voltage source 730 that provides power to the integrated circuit 710. In some embodiments, the voltage source 730 supplies current to the integrated circuit 710 through the system bus 720.

The integrated circuit 710 is electrically coupled to the system bus 720 and includes any circuit, or combination of circuits according to an embodiment. In an embodiment, the integrated circuit 710 includes a processor 712 that can be of any type. As used herein, the processor 712 may mean any type of circuit such as, but not limited to, a microprocessor, a microcontroller, a graphics processor, a digital signal processor, or another processor. In an embodiment, the processor 712 is a large die such as an Intel® Xeon® processor as disclosed herein. Other types of circuits that can be included in the integrated circuit 710 are a custom circuit or an application-specific integrated circuit (ASIC), such as a communications circuit 714 for use in wireless devices such as cellular telephones, smart phones, pagers, portable computers, two-way radios, and similar electronic systems. In an embodiment, the processor 710 includes on-die memory 716 such as static random-access memory (SRAM). In an embodiment, the processor 710 includes embedded on-die memory 716 such as embedded dynamic random-access memory (eDRAM).

In an embodiment, the integrated circuit 710 is complemented with a subsequent integrated circuit 711 that is coupled to integrated circuit 710. In an embodiment, the integrated circuit 710 is complemented with a subsequent integrated circuit 711 such as a graphics processor in connection with a more generic processor 710. Useful embodiments include a dual processor 713 and a dual communications circuit 715 and dual on-die memory 717 such as SRAM. In an embodiment, the dual integrated circuit 710 includes embedded on-die memory 717 such as eDRAM.

In an embodiment, the electronic system 700 also includes an external memory 740 that in turn may include one or more memory elements suitable to the particular application, such as a main memory 742 in the form of RAM, one or more hard drives 744, and/or one or more drives that handle removable media 746, such as diskettes, compact disks (CDs), digital variable disks (DVDs), flash memory drives, and other removable media known in the art. The external memory 740 may also be embedded memory 748 according to an embodiment. An example embodiment is the die 170 is analogous to the first die 118 and the die 711 is analogous to the subsequent die 318.

In an embodiment, the electronic system 700 also includes a display device 750, an audio output 760. In an embodiment, the electronic system 700 includes an input device such as a controller 770 that may be a keyboard, mouse, trackball, game controller, microphone, voice-recognition device, or any other input device that inputs information into the electronic system 700. In an embodiment, an input device 770 is a camera. In an embodiment, an input device 770 is a digital sound recorder. In an embodiment, an input device 770 is a camera and a digital sound recorder.

The computer system 700 may also include passive devices 780 that are coupled to active devices such as the integrated circuit 710. In an embodiment, the passive device 780 is an inductor that is used for an RF circuit.

A foundation substrate 790 may be part of the computing system 700. In an embodiment, the foundation substrate 790 is part of a server blade. In an embodiment, the foundation substrate 790 is a motherboard that holds a semiconductive device with a BBUL structure and laminated-core structure hybrid apparatus embodiment. In an embodiment, the foundation substrate 790 is a board onto which a semiconductive device with a BBUL structure and laminated-core structure hybrid apparatus is mounted. In an embodiment, the foundation substrate 790 incorporates at least one of the functionalities encompassed within the dashed line 790 and is a substrate such as the user shell of a wireless communicator.

As shown herein, the integrated circuit 710 can be implemented in a number of different embodiments, including a single-interface interconnect junction in a die according to any of the several disclosed embodiments and their equivalents, an electronic system, a computer system, one or more methods of fabricating an integrated circuit, and one or more methods of fabricating an electronic assembly that includes a BBUL structure and laminated-core structure hybrid apparatus according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a BBUL structure and laminated-core structure hybrid apparatus according to any of the several disclosed BBUL structure and laminated-core structure hybrid apparatus embodiments and their equivalents.

Although a die may refer to a processor chip, an RF chip or a memory chip may be mentioned in the same sentence, but it should not be construed that they are equivalent structures. Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" "above" and "below" may be understood by reference to the illustrated X-Z coordinates, and terms such as "adjacent" may be understood by reference to X-Y coordinates or to non-Z coordinates.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process comprising:
   embedding a semiconductor device in a bumpless build-up (BBUL) structure;
   assembling the BBUL structure to a laminated-core structure; and
   fusing the BBUL structure at a bond pad thereof to the laminated-core structure at a plated through hole (PTH) thereof by plating a conductive material, wherein the fusing forms a hollow cylindrical reinforcement plating that is closed on one end thereof.

2. The process of claim 1, wherein fusing the BBUL structure and the laminated-core structure is achieved by electroless plating a copper material to form the reinforcement plating.

3. The process of claim 1, further including assembling a land-side structure to the laminated-core structure.

4. The process of claim 1, further including filling the PTH with a filler material that includes an organic material and an inorganic particulate.

5. The process of claim 1, wherein the BBUL structure includes a die side, the process further including assembling a die-side contact pad at the die side.

6. The process of claim 1, further including:
   assembling a land-side structure to the laminated-core structure; and
   assembling the land-side structure to a foundation substrate.

7. A method of forming a semiconductor apparatus comprising:
   embedding a semiconductive die in a bumpless build-up layer (BBUL) structure;
   abutting a laminated-core structure to the BBUL structure;
   electrically coupling the laminated-core structure and the BBUL structure by forming an electrically conductive body that is integral to both, wherein the electrically conductive body is a hollow cylinder that is closed on one end thereof.

8. The method of claim 7, wherein the laminated-core structure includes a copper plated through hole, wherein the BBUL structure includes a copper subsequent bond pad, and wherein the electrically conductive body is copper that is fused to the copper plated through hole and to the copper subsequent bond pad.

9. The method of claim 7, wherein the laminated-core structure includes a copper plated through hole (PTH) having a width in a range from 100 μm to 120 μm and a thickness in a range from 400 μm to 1,400 μm, wherein the BBUL structure includes a copper subsequent bond pad, and wherein the electrically conductive body is copper that is fused to the copper plated through hole and to the copper subsequent bond pad.

10. The method of claim 7, wherein the electrically conductive body is fused to a plated through hole in the laminated-core structure and to a subsequent bond pad on the BBUL structure.

11. The method of claim 7, wherein embedding the semiconductive die in the BBUL structure comprises embedding a first semiconductive die in the BBUL structure, and further comprising embedding a subsequent semicondictive die in the BBUL structure.

12. The method of claim 7, wherein the BBUL structure includes a die side and a die-side contact pad formed on the BBUL structure die side.

13. The method of claim 12, further comprising mounting a package-on-package apparatus on the BBUL structure die side, such that the package-on-package apparatus is electrically coupled at the die-side contact pad.

14. The method of claim 7, further including forming a foundation substrate, and mounting the laminated core structure to the foundation substrate.

15. A method of forming a semiconductive device comprising:
  embedding a die in a bumpless build-up layer (BBUL), wherein the die includes an active surface and a backside surface, the BBUL including:
    a dielectric first film and a first contact disposed in the dielectric first film and making contact with the die at the active surface; and
    a dielectric subsequent film and a subsequent contact disposed in the dielectric subsequent film, wherein the subsequent contact is coupled to the first contact and further including a subsequent contact pad;
  assembling a laminated-core structure at the subsequent contact pad, wherein the laminated-core structure includes:
    a plated through hole (PTH) upon a PTH wall; and
    a reinforcement plating that is fused to the PTH and the subsequent contact pad, wherein the reinforcement plating is a hollow cylinder that is closed on one end thereof; and
  coupling a land-side structure to the PTH, wherein the land-side structure includes laminated-core land-interface bond pads that are coupled to the PTH, wherein the laminated-core land-interface bond pads are in electrical contact with corresponding land-side contactor pads of the land-side structure.

16. The method of claim 15, further including assembling a foundation substrate at the land-side contact pads.

17. The method of claim 15, wherein the laminated-core structure includes a copper plated through hole, wherein the BBUL structure includes a copper subsequent bond pad, and wherein the reinforcement plating is copper that is fused to the copper plated through hole and to the copper subsequent bond pad.

18. The method of claim 15, wherein the laminated-core structure includes a copper plated through hole (PTH) having a width in a range from 100 μm to 350 μm and a thickness in a range from 400 μm to 1,400 μm, wherein the BBUL structure includes a copper subsequent bond pad, and wherein the reinforcement plating is copper that is fused to the copper plated through hole and to the copper subsequent bond pad.

19. The method of claim 15, wherein the BBUL structure includes a die side having a die-side contact pad thereon.

20. The method of claim 19, further comprising mounting a package-on-package apparatus on the BBUL structure die side, such that the package-on-package apparatus is electrically coupled at the die-side contact pad.

\* \* \* \* \*